US012488957B2

(12) United States Patent
Rue

(10) Patent No.: US 12,488,957 B2
(45) Date of Patent: Dec. 2, 2025

(54) CRENELLATED SAMPLE HOLDER AND SPUTTER TARGET FOR SAMPLE PREPARATION IN CRYO ELECTRON MICROSCOPY APPLICATIONS

(71) Applicant: FEI Company, Hillsboro, OR (US)

(72) Inventor: Chad Rue, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 344 days.

(21) Appl. No.: 18/193,545

(22) Filed: Mar. 30, 2023

(65) Prior Publication Data

US 2024/0331969 A1 Oct. 3, 2024

(51) Int. Cl.

*H01J 37/20* (2006.01)
*C23C 14/14* (2006.01)
*C23C 14/34* (2006.01)
*H01J 37/28* (2006.01)
*H01J 37/305* (2006.01)

(52) U.S. Cl.

CPC .............. *H01J 37/20* (2013.01); *C23C 14/14* (2013.01); *C23C 14/3407* (2013.01); *H01J 37/28* (2013.01); *H01J 37/305* (2013.01); *H01J 2237/081* (2013.01); *H01J 2237/20214* (2013.01); *H01J 2237/31749* (2013.01)

(58) Field of Classification Search

CPC .......... H01J 37/20; H01J 37/28; H01J 37/305; H01J 37/3429; H01J 37/26; H01J 2237/081; H01J 2237/20214; H01J 2237/31749; C23C 14/14; C23C 14/3407

USPC ..................................................... 250/440.11

See application file for complete search history.

(56) References Cited

U.S. PATENT DOCUMENTS 5,741,404 A * 4/1998 Cathey ................ H01J 37/3423 204/298.18
2014/0028828 A1* 1/2014 Hunt ........................ G01N 1/32 348/79

OTHER PUBLICATIONS

Slamkova, Spin Mill method for large-area planar milling, ThermoFisher Application note (2021), 4 pages.
Li, Spin Mill with Plasma FIG, University of Alberta nanoFAB Characterization Centre (Aug. 21, 2022), 6 pages.

* cited by examiner

*Primary Examiner* — Jason L Mccormack
(74) *Attorney, Agent, or Firm* — Klarquist Sparkman, LLP

(57) ABSTRACT

To reduce charging artifacts in electron microscopy, a notched ring of sputterable material can be situated about a sample surface. An ion beam can be directed through a notch at to sputter the sputterable material onto the sample surface. Sputtering can be performed after low-angle focused ion beam (FIB) milling at the same sample tilts. The sample can be rotated about an axis and sputtering performed at multiple rotation angles. Upon sputtering of the conductive coating, the sample can be reoriented and imaged. These steps can be repeated to produce a 2D image stack for 3D image reconstruction.

22 Claims, 10 Drawing Sheets

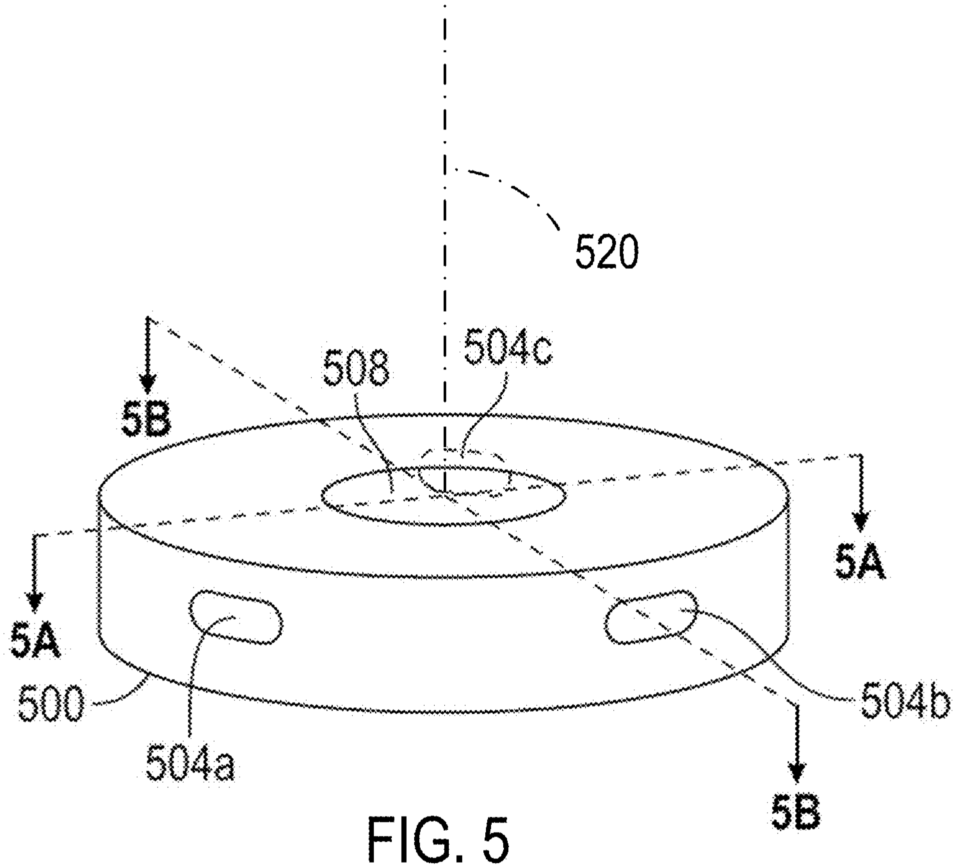
FIG. 5
FIG. 5B
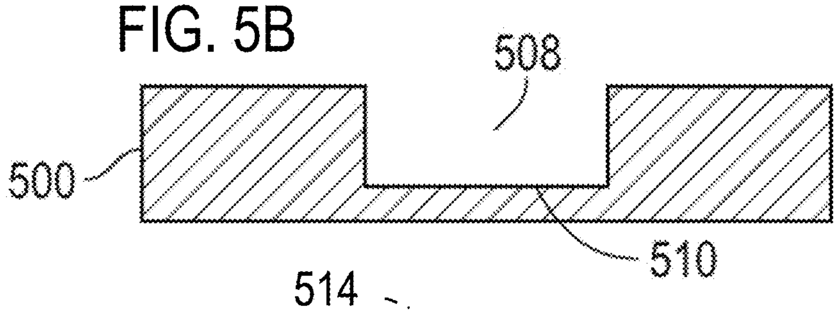
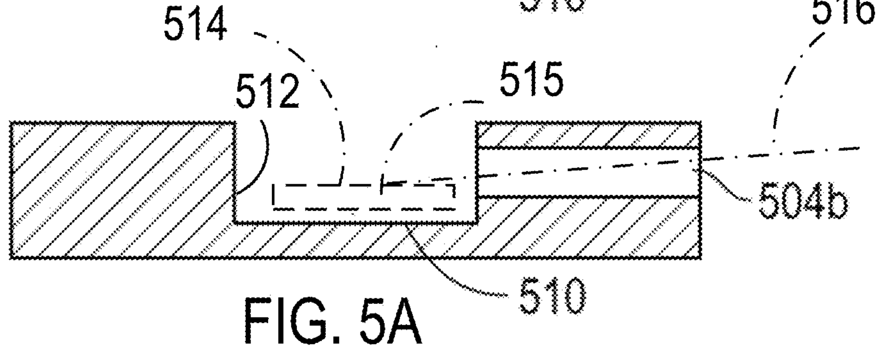
FIG. 5A

CRENELLATED SAMPLE HOLDER AND SPUTTER TARGET FOR SAMPLE PREPARATION IN CRYO ELECTRON MICROSCOPY APPLICATIONS

FIELD

The disclosure pertains to sputtering devices for use with charged-particle beam systems.

BACKGROUND

Sample charging in charged-particle beam (CPB) microscopy such as in a scanning electron microscope (SEM) can make it difficult or impossible to locate or image sample areas of interest. Sample charging can also impede focused ion beam (FIB) processing which can be used to mill a sample surface to reveal additional portions of a sample or to prepare sample lamella. While some samples of interest are conductive and do not exhibit charging artifacts, many samples of interest are nonconductive. For example, samples prepared for SEM using High Pressure Freezing (HPF) have thick ice that causes considerable charging during SEM/FIB operation. This makes it difficult to locate an area of interest, access that area using focused ion beam milling, and prepare a lamella for subsequent transmission electron microscope (TEM) imaging. For these reasons, approaches for applying conductive coatings to samples are desired, typically approaches are preferred that permit in situ application of the conductive coatings.

SUMMARY

Sample holders for glancing angle milling of a sample situated in a charged-particle beam instrument include a conductive material defining an internal cavity adapted to receive the sample at a sample surface, the conductive material defining at least one window that provides a glancing angle charged particle beam (CPB) processing path to the sample surface as situated in the CPB instrument. A sputterable material is situated opposite the at least one window to define a CPB sputtering path through the at least one window to the sputterable material. Sample processing by, for example, CPB milling can be accomplished with the CPB at a glancing angle with respect to the sample surface; for sputtering, the CPB is generally incident to the sputterable material at angles determined based on window dimensions and distance from a window to the sputterable material, and such angles are generally not glancing angles. With such a sputtering target, a conductive coating can be sputtered onto a sample without removing the sample. In addition, a sputtered coating can be provided after each sample milling operation so that a sample surface can be imaged without or with reduced charging artifacts. This is particularly useful in imaging of frozen biological samples which can be imaged at different sample depths by CPB (usually focused ion beam) milling followed by sputtering to avoid charging artifacts.

Directing a CPB through a window to a sample at a glancing angle can be used to process at least a portion of the sample surface by ion beam milling or other process. Directing a CPB through the window in sample mount to a sputtering target (typically at an angle that can be or approach normal incidence) can be used to sputter a conductive material on at least a portion of a sample surface. After sputtering, a sample surface can be imaged and then the preceding steps repeated to build up a set of images associated with different sample depths.

The foregoing and other features and advantages will become more apparent from the following detailed description, which proceeds with reference to the accompanying figures.

BRIEF DESCRIPTION OF THE DRAWINGS

FIG. 5 is a perspective view of a representative sample holder that includes a windowed sputtering target in which windows are defined by through-holes.

FIGS. 5A-5B are sectional views of the sample holder of FIG. 5.

DETAILED DESCRIPTION

Figure 1A:
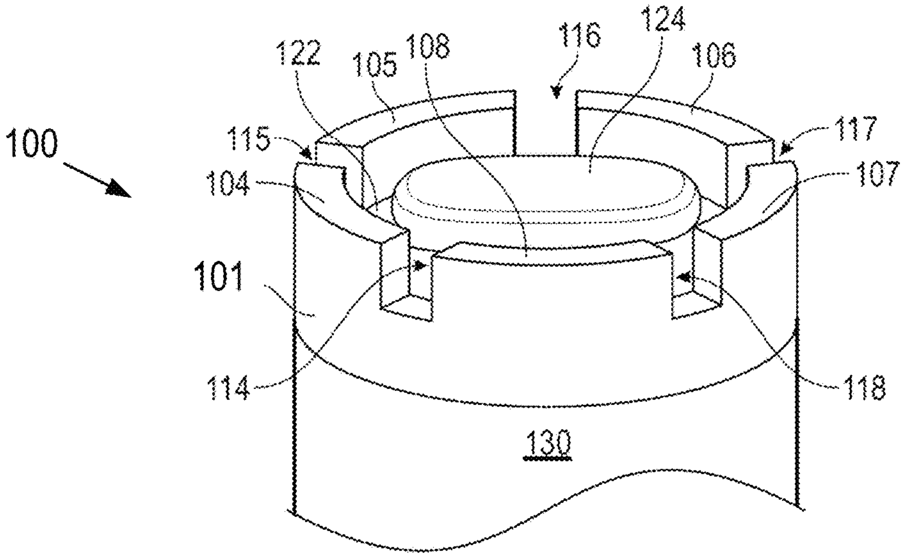
FIG. 1A is a perspective view of a representative sample holder that includes a windowed ("crenellated") sputtering target that is configured to surround a sample.

Disclosed herein are embodiments of sputtering targets that can be situated for sputtering conductive layers onto samples situated for charged particle beam imaging and ion beam milling in a CPB apparatus. In some examples, the sputtering targets are generally ring shapes that surround the sample as situated for CPB imaging. Such targets can be adapted to provide sample mounting as well as providing sputtering material. Such surrounding members are conveniently implemented as crenellated rings that define one or more crenellations (i.e., slots) that extend from an imaging beam facing side toward a sample plane. For convenience in description, directions or surfaces closer to an imaging CPB or upstream of a CPB path are referred to as proximal and directions or surfaces further downstream on an imaging CPB path are referred to as distal.

Openings defined in a crenellated ring are arranged so to that a processing CPB (typically an ion beam such as a focused ion beam (FIB)) can be selectively directed either to a sample surface or to a sputtering material provided by the crenellated ring. The crenellations are configured so that the processing beam can be directed to the sample surface through the crenellations at a glancing angle, wherein as used herein a glancing angle is an angle between the CPB propagation direction and a plane defined by the sample surface of less than 15°, 10°, 7.5°, 5°, 2.5°, or 1°. As used herein, "ring-shaped" or "ring" refers not only to circular rings or portions thereof but also to triangular, rectangular, or other regular or irregular polygonal or curved shapes or combinations thereof that defined a perimeter. In addition, portions of rings can be used that need not completely surround a sample and that do not define a complete perimeter. In other examples, complete or partial disk-shaped members can be used. Glancing angle incidence to a sample surface and access to sputterable material is usually provided by tilting a sample and sample surrounding member with respect to a CPB axis.

While it is convenient to provide the sputterable material as a solid portion such as by forming the crenellated ring of a sputterable material, the sputterable material can also be provided on portions of a surrounding member as may be convenient. With such sputterable rings or ring portions, a conductive coating can be applied to a sample situated for CPB processing by directing an ion beam through a slot to sputterable portions of the ring such as an opposite side of the ring with respect to the slot to produce a conductive coating on the sample by sputtering. Sputtering from ring portions can result in shadowing due to sample features; in order to mitigate this shadowing, an ion beam or other beam used to generate the sputtered material can be directed to sample surface from different directions by rotation of the sample. Thus, sputtering from multiple directions is often desirable and the sample and the ring can be rotated so that additional slots are situated so that the ion beam is directed through the different slots sequentially to produce sputtering from additional portions of the ring. In most cases, the sample and the ring are fixed to each other and are rotated together. Rings or partial rings can also be provided with apertures or to permit access to a sample and to the sputtering material by a CPB. Odd numbers of such slots and rotations are used as odd numbers of slots with uniform angular spacing generally provide superior performance in reducing shadowing.

It can be convenient to fix the sputtering target to a sample support to form a sample holder as a single piece or multiple pieces. As noted above, sputterable material can be provided on a ring as the ring material or additional plates or other pieces of a suitable material. A sample holder can be provided with screw threads or clamps for securing within a charge particle beam instrument.

In some particular examples, the disclosed approaches are used with samples that are processed using low angle FIB milling in which a thin layer is removed from a sample surface at a nearly glancing angle, typically using a plasma ion beam based on xenon, argon, nitrogen or oxygen. In some cases, the sample is rotated with respect to the FIB. Commonly used angles of incidence are between 1° and 5° with respect to the sample plane. The sample is tilted with respect to the ion beam to produced glancing angle incidence and the sample stage is then periodically rotated to a series of milling positions and ion beam milled to produce a suitable milled surface. After spin-milling, the sample is tilted back into position for imaging. This process can be repeated, and sample slices imaged iteratively, to produce a 2D-image stack that can be combined for 3D visualization of features of interest. Some or all portions of a sample surface can be spin-milled for imaging.

In another embodiment, glancing angle FIB milling is used to expose a buried target of interest within the sample. In such cases, periodic 2D images may not need to be collected during the FIB milling, and a 3D visualization may not be performed. Rather, the FIB milling is simply used to remove material to reveal buried structures in the sample. When a suitable region of interest has been exposed and identified, the sample may be subjected to subsequent treatments, such as high-resolution SEM imaging or lamella preparation. With the disclosed approaches, samples can be processed (milled) and imaged without artifacts through a specimen thickness.

Example 1

Figure 1B:
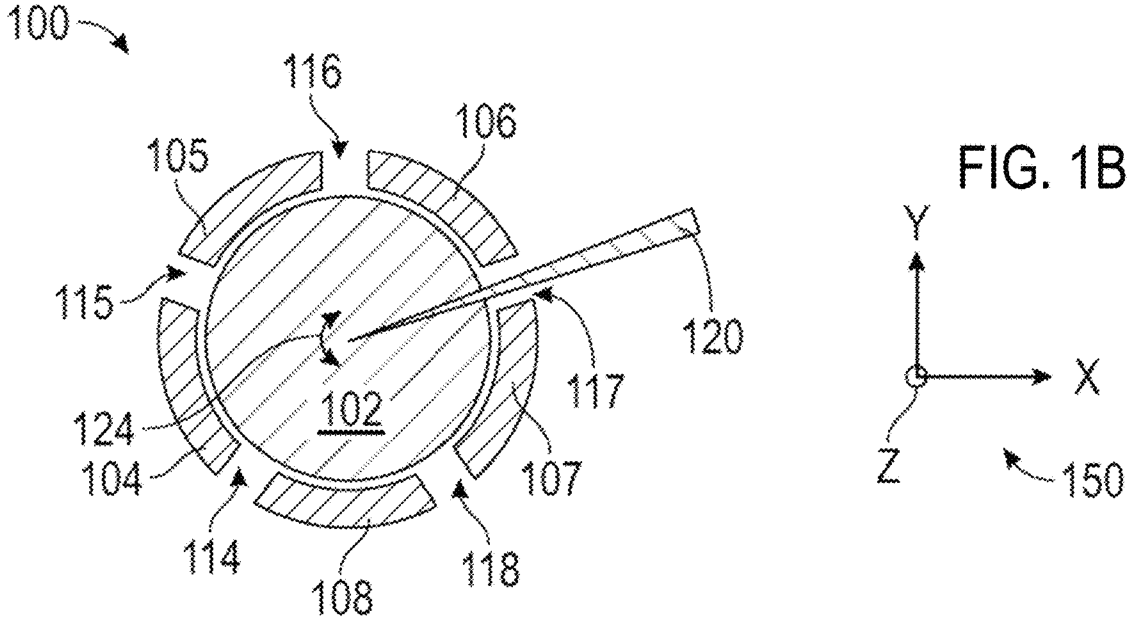
FIG. 1B is a sectional view of the sample holder of FIG. 1A.
Figure 1C:
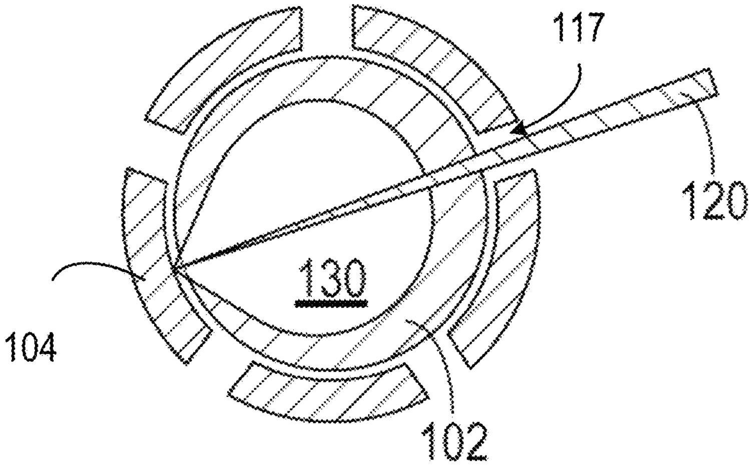
FIG. 1C illustrates a sputtering plume deposited on a sample situated in the sample holder of FIGS. 1A-1B.

Referring to FIGS. 1A-1C, a representative sample holder 100 includes a ring-shaped surrounding member 101 situated about a sample support 124. The surrounding member 101 is a crenellated ring that includes risers (merlons) 104-108 that define slots (crenellations) 114-118. The surrounding member 101 is situated on a base 130 that is configured for securing the sample support 124 and the ring-shaped surrounding member 101 in an electron microscope such as a scanning electron microscope or other charged particle beam (CPB) instrument. The surrounding member 101 is typically formed of a sputterable material such as carbon or stainless steel. In the example of FIG. 1A-1C, the surrounding member 101 includes five slots, but in other examples 1. 2, 3, 4, or more slots can be provided.

As shown in FIG. 1B, a sample surface 102 is oriented in an xy-plane to receive an imaging CPB along a z-axis defined in a rectangular coordinate system 150. A charged particle processing beam (CPPB) 120 such as a focused ion beam (FIB) can be directed toward the sample surface 102 through the slot 117 at a glancing angle for sample processing by, for example, ion beam milling. Tilt is generally obtained by tilting the sample surface 102 with respect to a CPB axis. As shown in FIG. 1C, the CPPB 120 is directed through the slot 117 to the riser 104 to generate a sputtered plume 130 that is deposited on a sample surface as a conductive layer. As shown, the CPPB 120 accesses the sputterable material of the surrounding member 101 and the surface of the sample 102 via the windows 114-117 and the surrounding member 101 provides the sputterable material. For sputtering, the CPB can be incident to the sputterable material at non-glancing angles, and typically at angle that approach normal incidence. For example, the risers such as riser 105 can have interior surfaces that are parallel to the z-axis to so that ion beam milling at 1-5 degrees can be associated with sputtering with angles of incidence of 85-89 degrees to the sputterable material, but other angles can be used.

The sample holder 100, sample 102, and surrounding member 101 are fixed to each other and rotated as shown at 124 so that the CPPB 120 accesses the sample surface 102 and a selected riser through an associated slot to generate additional sputtering plumes. Slots are typically used to provide access for the CPPB 120 for various rotations of sample holder. The plume 130 shown in FIG. 1C extends from the surrounding member 101 towards the sample 102. For this reason, depending on the portion of the sample 102 to be coated with a sputterable material, the sputtering member 101 is rotated along with the sample so that the CPPB beam 120 can be applied through some or all of the slots 114-118. Slots are normally situated in the surrounding member 101 so that a portion of a corresponding riser is accessible by the CPPB 102 through the respective window. Multiple windows can be provided in various arrangements, and typically as symmetric arrangements that include an odd number of windows that are evenly angularly spaced.

Example 2

Figure 2:
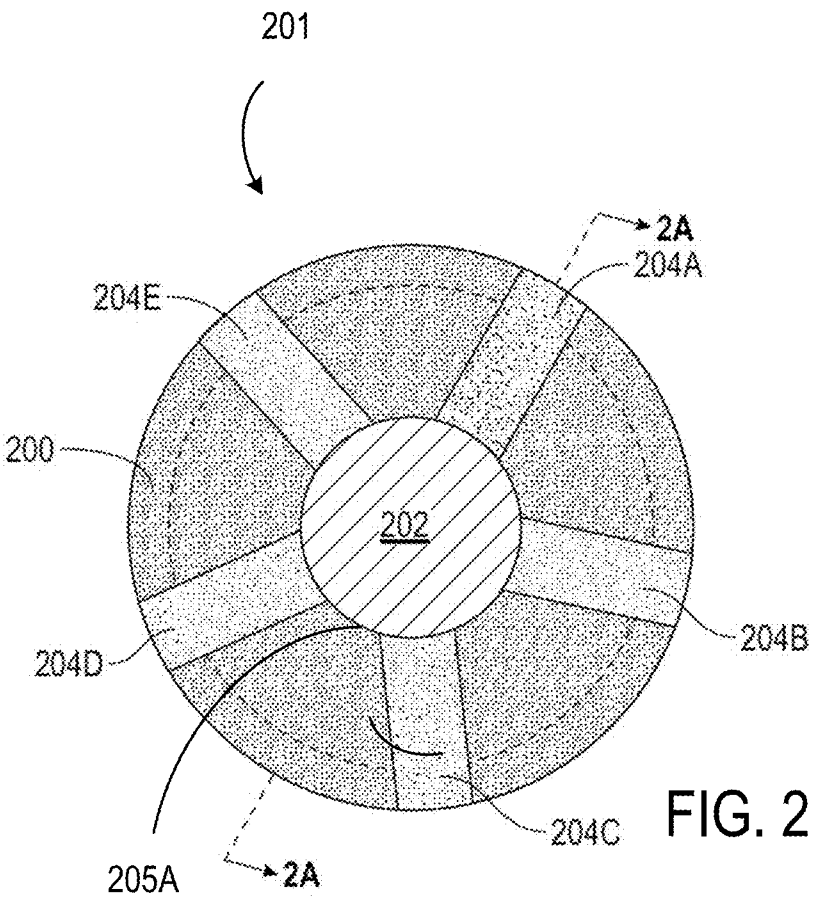
FIGS. 2-2A illustrate a representative sample holder that includes a windowed sputtering target.
Figure 2A:
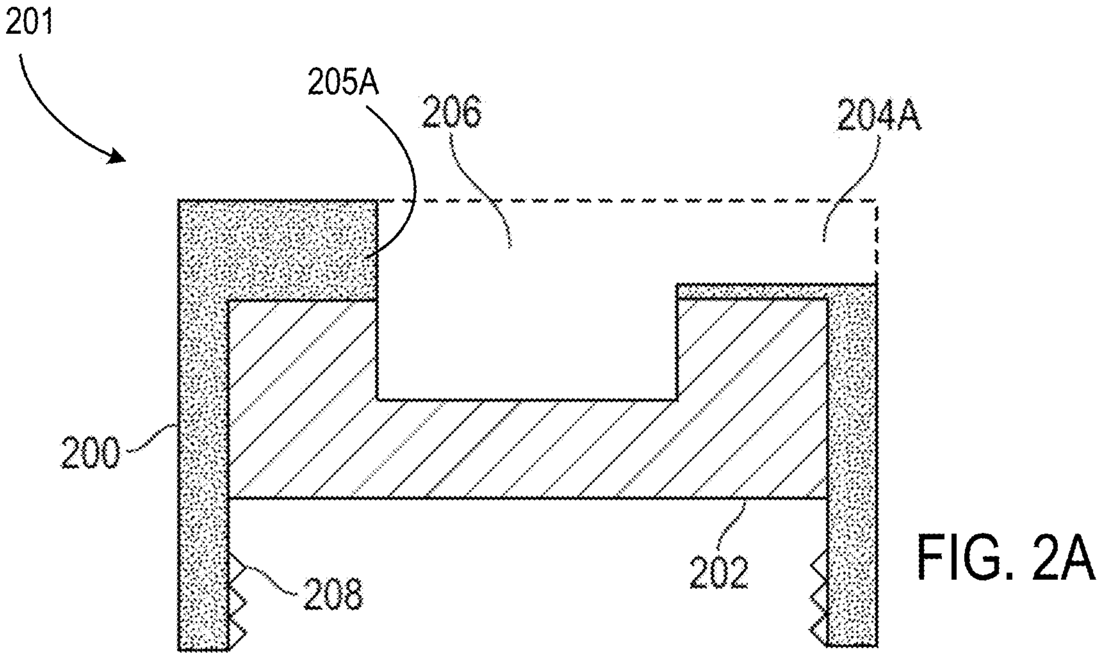

Referring to FIGS. 2 and 2A, a representative sample mounting assembly 201 includes a surrounding member 200 that is coupled to a sample holder 202 in which a cavity 206 is defined for placement of a sample. The surrounding member 200 has a generally disk-shaped appearance as shown in FIG. 2. The sampling mounting assembly 201 is securable to additional sample mounting hardware with screw threads 208. In this example, the screw threads 208 are shown as internal screw threads on the surrounding member 200, but in other examples, external screw threads can be provided, or screw threads can be provided on the sample holder 202 as lengthened to extend beyond the surrounding member 200. Slots 204A-204E for transmission of a CPPB are evenly angularly spaced about the cavity 206. The surrounding member 200 is illustrated as being formed of a sputterable material so that, for example, a CPPB entering the slot 204A is incident to sputterable material situated at a portion 205A of an interior facing portion of the surrounding member 200.

Example 3. Imaging System

Figure 3:
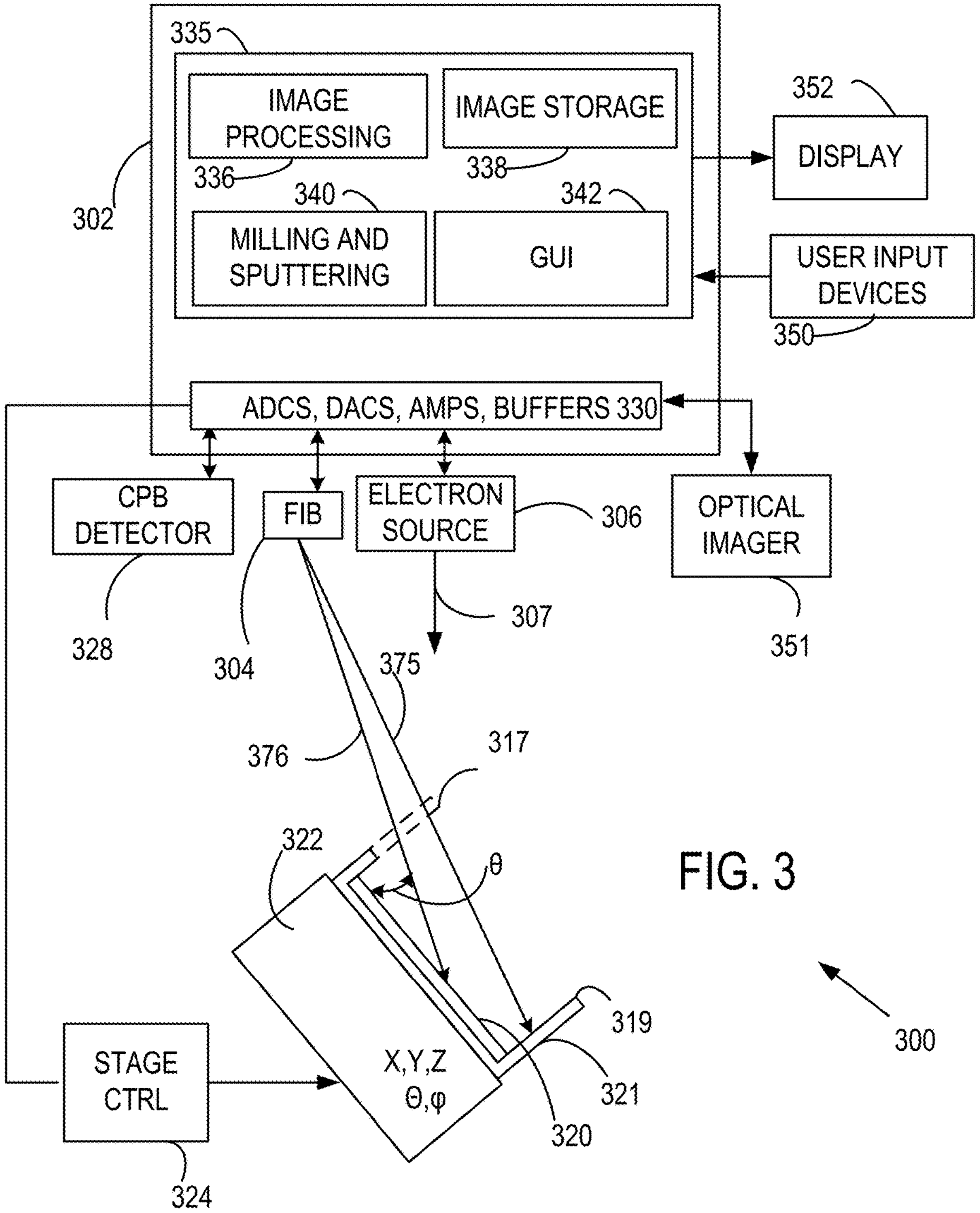
FIG. 3 illustrates a representative imaging apparatus having a sample retained in a sample holder that includes a sputterable surrounding member.

Referring to FIG. 3, a dual CPB imaging/milling system 300 includes a system controller 302 that is coupled to an ion beam source 304 such as a focused ion beam source (FIB) and an electron beam source 306 that produce an ion beam and an electron beam 307, respectively, that are scannable with respective scanners. As shown in FIG. 3, the ion beam is scanned along paths 375, 376 to be incident to a surface of a sample 320 or a sputterable portion 321 of a surrounding member 319 through a slot 317 such as illustrated above for low angle FIB milling (path 376) or sputtering (path 375). As shown, the sample 320 is tilted with respect to the electron beam 307 for low angle FIB milling. The sample 320 is situated so that the FIB is incident at or near a glancing angle for milling. In low angle milling and sputtering, the ion beam is generally incident at an angle θ with respect to a sample surface plane 321 that is referred to herein as a glancing angle. It will be appreciated that for sputtering, the FIG angle of incidence to sputterable material is generally not a glancing angle. Images are typically obtained using the electron beam 307, and the ion beam is used for sample modification such as milling and sputtering of conductive material onto a sample surface. However, images can be obtained with either one or both of the ion beam and the electron beam 307.

The sample 320 and the surrounding member 319 can be secured to a stage 322 that is coupled to a stage controller 324 that is in turn coupled to the system controller 302. The stage 322 generally can provide one or more translations, rotations, or tilts as directed by the system controller 302. A beam responsive and incident CPB (such as an electron beam or an ion beam) is directed to CPB detector 328 which is coupled to system electronics 330 which can include one or more analog-to-digital convertors (ADCs), digital to analog-convertors (DACs), amplifiers, and buffers for control of the detector 328 and processing (amplification, digitization, buffering) of signals associated with the detector 328. In other examples, a photon detector is used that produces an electrical signal that is further processed by the system electronics. In most practical examples, at least one ADC is used to produce a digitized detector signal that can be stored in one or more tangible computer readable media (shown as image storage 332) as an image. In other examples, image storage is remote via a communication connection such as a wired or wireless network connection. The beam received by the CPB detector 228 can be scattered portions of an ion beam, an electron beam, secondary electrons, ions, or neutral atoms. An optical imager 351 such as a camera is coupled to produce an optical image of the specimen 320.

The system controller 302 is coupled to a memory 335 that stores processor-executable instructions for image processing 336, storage and acquisition images 338, select sample areas for milling. sample rotations for low angle milling and sputtering, and to provide a graphical user interface (GUI) 342 for various functions, including selecting portions of interest of a sample. The system controller 302 establishes image acquisition parameters and is in communication with the stage controller 324. Sample images can be presented on a display 352, and system control and imaging parameters can be specified using internally stored values from the memory 335 or provided by a user with one or more user input devices 350. As discussed above, in some examples spin-milling, sputtering, and imaging are performed iteratively to produce a 2D image stack.

It will be appreciated that the layout of FIG. 3 is for convenient illustration, and actual alignments of various beam sources, the optical imager, and the CPB detector(s) are not shown.

Example 4. Representative Computing Environment

Figure 4:
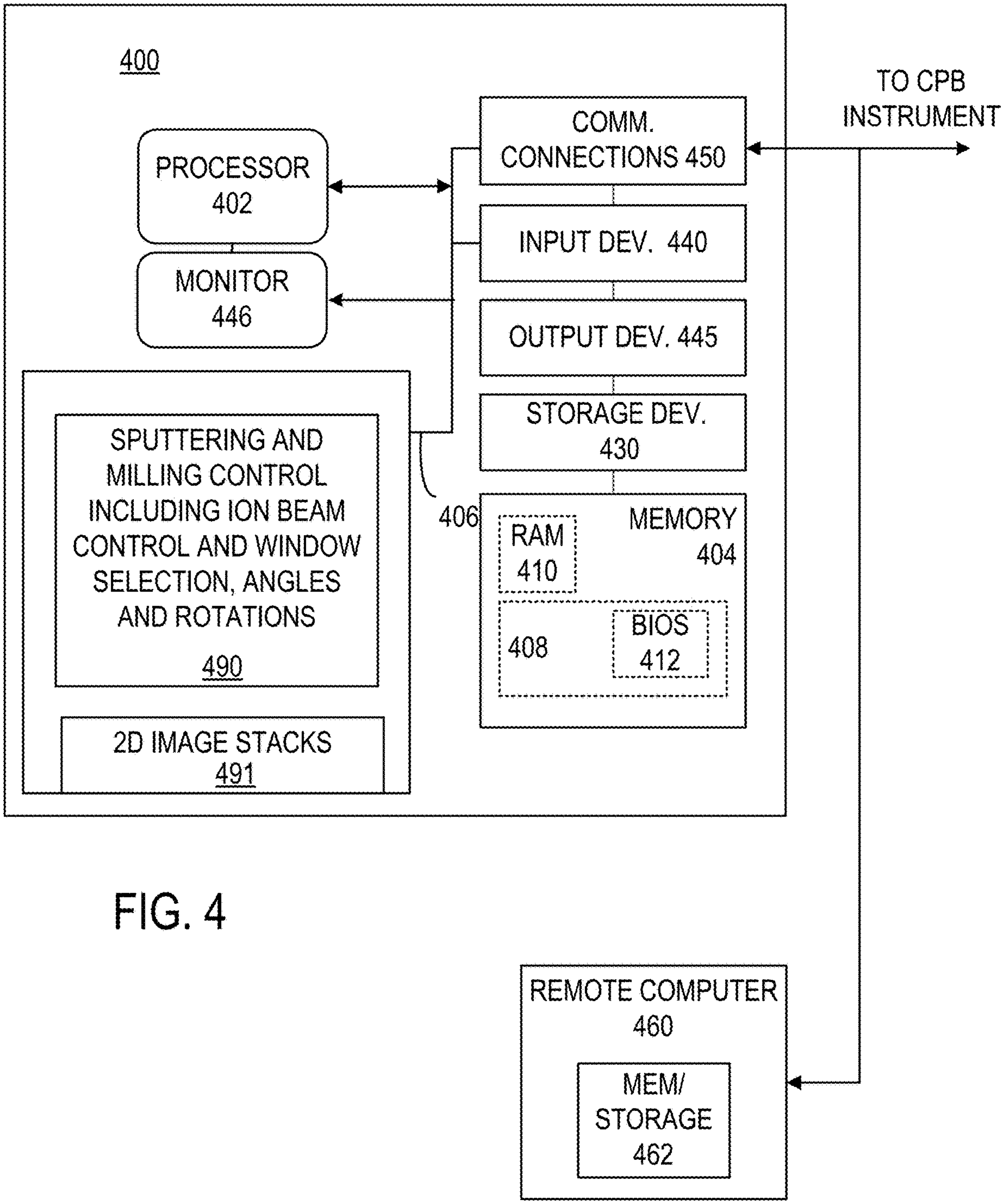
FIG. 4 illustrates a representative computing environment for control of image acquisition and processing, spin milling, and sputtering.

FIG. 4 and the following discussion are intended to provide a brief, general description of an exemplary computing environment in which the disclosed technology may be implemented. In particular, some or all portions of this computing environment can be used with the above methods and apparatus to, for example, control beam scanning and image processing to identify and align section images, preview images, and image storage. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including handheld devices, tablets, multiprocessor systems, microprocessor-based or programmable consumer electronics, network PCs, minicomputers, mainframe computers, gate arrays, programmable logic devices, and the like. The disclosed technology may also be practiced in distributed computing environments where tasks are performed by remote processing devices that are linked through a communications network. In a distributed computing environment, program modules may be located in both local and remote memory storage devices. In some cases, such processing is provided in an SEM. The disclosed systems can serve to control image acquisition and provide a user interface as well as serve as an image processor.

With reference to FIG. 4, an exemplary system for implementing the disclosed technology includes a general-purpose computing device in the form of an exemplary conventional PC 400, including one or more processing units 402, a system memory 404, and a system bus 406 that couples various system components including the system memory 404 to the one or more processing units 402. The system bus 406 may be any of several types of bus structures including a memory bus or memory controller, a peripheral bus, and a local bus using any of a variety of bus architectures. The exemplary system memory 404 includes read only memory (ROM) 408 and random-access memory (RAM) 410. A basic input/output system (BIOS) 412, containing the basic routines that help with the transfer of information between elements within the PC 400, is stored in ROM 408.

The exemplary PC 400 further includes one or more storage devices 430 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 406 by a hard disk drive interface, a magnetic disk drive interface, and an optical drive interface, respectively. The drives and their associated computer readable media provide nonvolatile storage of computer-readable instructions, data structures, program modules, and other data for the PC 400. Other types of computer-readable media which can store data that is accessible by a PC, such as magnetic cassettes, flash memory cards, digital video disks, CDs, DVDs, RAMs, ROMs, and the like, may also be used in the exemplary operating environment. Storage devices and computer-readable media as used herein refer to non-transitory devices and media.

A number of program modules may be stored in the storage devices 430 including an operating system, one or more application programs, other program modules, and program data. A user may enter commands and information into the PC 400 through one or more input devices 440 such as a keyboard and a pointing device such as a mouse. For example, the user may enter commands to initiate image acquisition or spin milling or to select which slots or numbers of slots are to be used for sputtering. Other input devices may include a digital camera, microphone, joystick, game pad, satellite dish, scanner, or the like. These and other input devices are often connected to the one or more processing units 402 through a serial port interface that is coupled to the system bus 406 but may be connected by other interfaces such as a parallel port, game port, universal serial bus (USB), or wired or wireless network connection. A monitor 446 or other type of display device is also connected to the system bus 406 via an interface, such as a video adapter, and can display, for example, one or more section images (i.e., images used in identifying and locating sections), preview images, ROI images or other raw or processed images such as images after alignment or with displayed values of translations and rotations needed for alignment, The monitor 446 can also be used to select sections for processing or particular image alignment and alignment procedures such as correlation, feature identification, and preview area selection or other image selection. Other peripheral output devices, such as speakers and printers (not shown), may be included.

The PC 400 may operate in a networked environment using logical connections to one or more remote computers, such as a remote computer 460. In some examples, one or more network or communication connections 450 are included. The remote computer 460 may be another PC, a server, a router, a network PC, or a peer device or other common network node, and typically includes many or all of the elements described above relative to the PC 400, although only a memory storage device 462 has been illustrated in FIG. 4. The personal computer 400 and/or the remote computer 460 can be connected to a logical a local area network (LAN) and a wide area network (WAN). Such networking environments are commonplace in offices, enterprise-wide computer networks, intranets, and the Internet. In some examples, a stack of aligned image is transmitted to a remote system for 3D image reconstruction or other processing.

As shown in FIG. 4, a memory 490 (or portions of this or other memory) stores processor executable instructions for image acquisition, ion beam scanning for milling or sputtering, specimen rotation angles for single or multi-window sputtering, image processing, and other operations. Image stacks can be stored in a memory portion 491.

Example 5

With reference to FIGS. 5 and 5A-5B, a representative disk-shaped surrounding member 500 includes a plurality of apertures such as representative apertures 504*a*-504*c* that are situated to permit an ion beam to access a central cavity 508 that is configured to receive a sample. In this example, three apertures are provided that are equally angularly spaced about the central cavity 508, and oblong or other shaped apertures are used instead of slots. The central cavity 508 is typically situated along an imaging axis 510 in a CPB apparatus for sample imaging. For low angle FIB milling and sputtering, the surrounding member 500 is tilted with respect to the axis 520 so that an ion beam is selectively directed to an interior surface 512 (at a substantial, non-glancing angle) or at a glancing angle to a surface 514 of a sample 515 along an axis 516. The sample 515 can be situated on or secured to a surface 510 of the surrounding member 500.

Example 6

Figure 6:
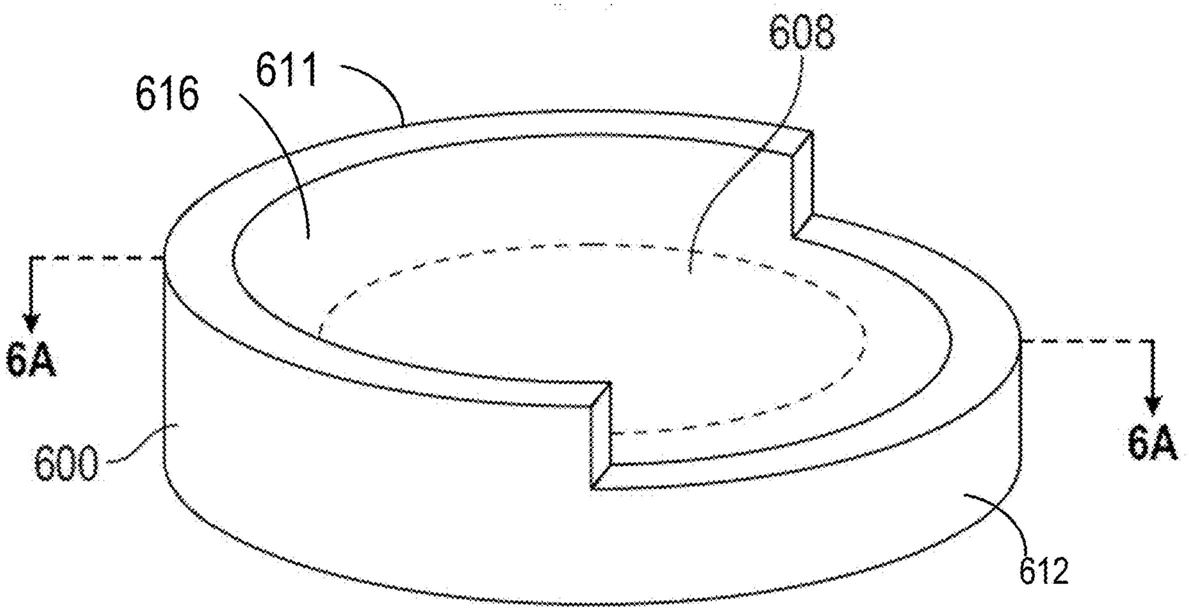
FIG. 6 is a perspective view of a representative sample holder that includes a windowed sputtering target defining a single window.
Figure 6A:
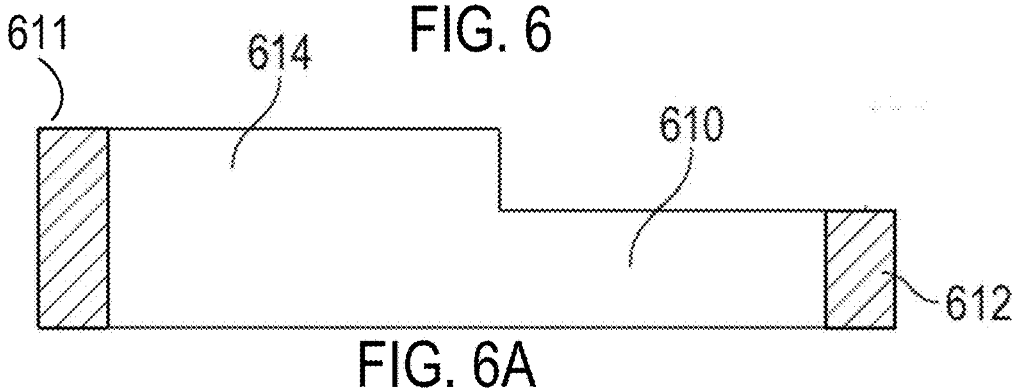
FIG. 6A is sectional view of the sample holder of FIG. 6.

Referring to FIGS. 6-6A, a ring-shaped partial surrounding member 600 defines a sample volume that includes a sample mounting surface 608. A first partial ring-shaped portion 611 extends above the sample mounting surface 608 and a second partial ring-shaped portion 612. The first portion 611 provides a region 614 for ion beam access to produce sputtered material from an interior-facing surface 616. The sputterable material can be port of the surrounding member 600 or a separate piece secured to the surrounding member 600.

Example 7

Figure 7A:
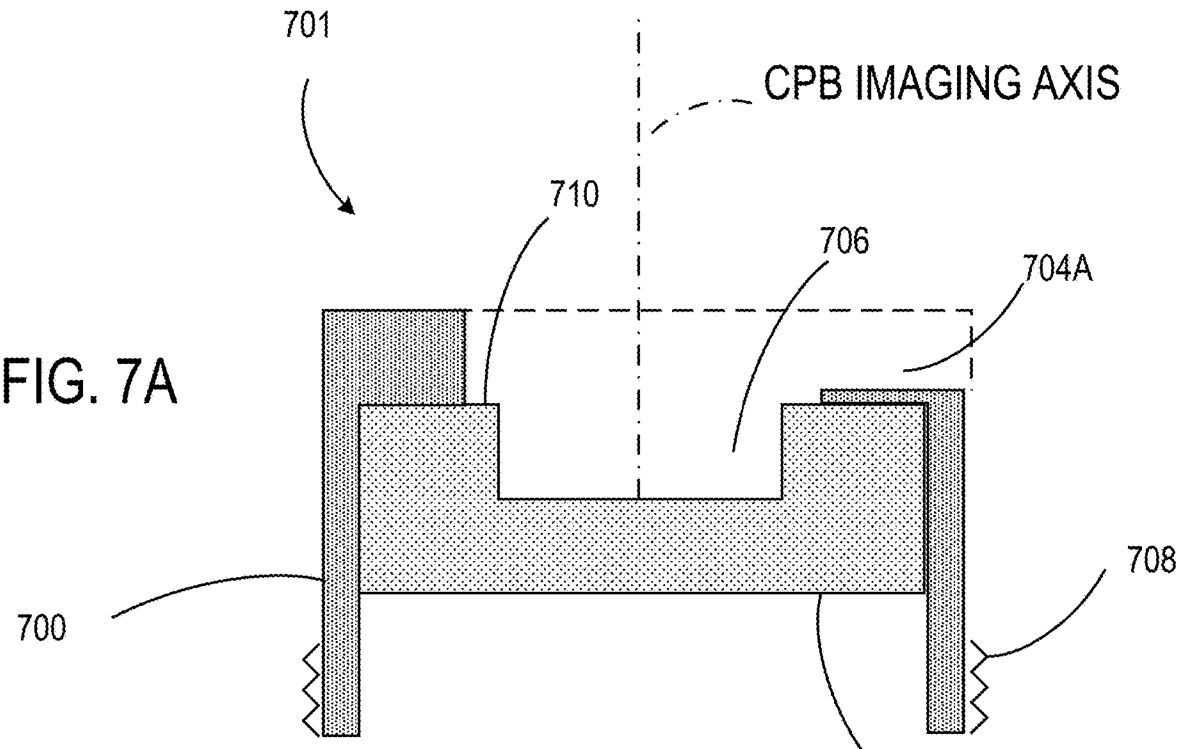
FIGS. 7A-7B illustrates another representative sample holder and sputterable surrounding member.
Figure 7B:
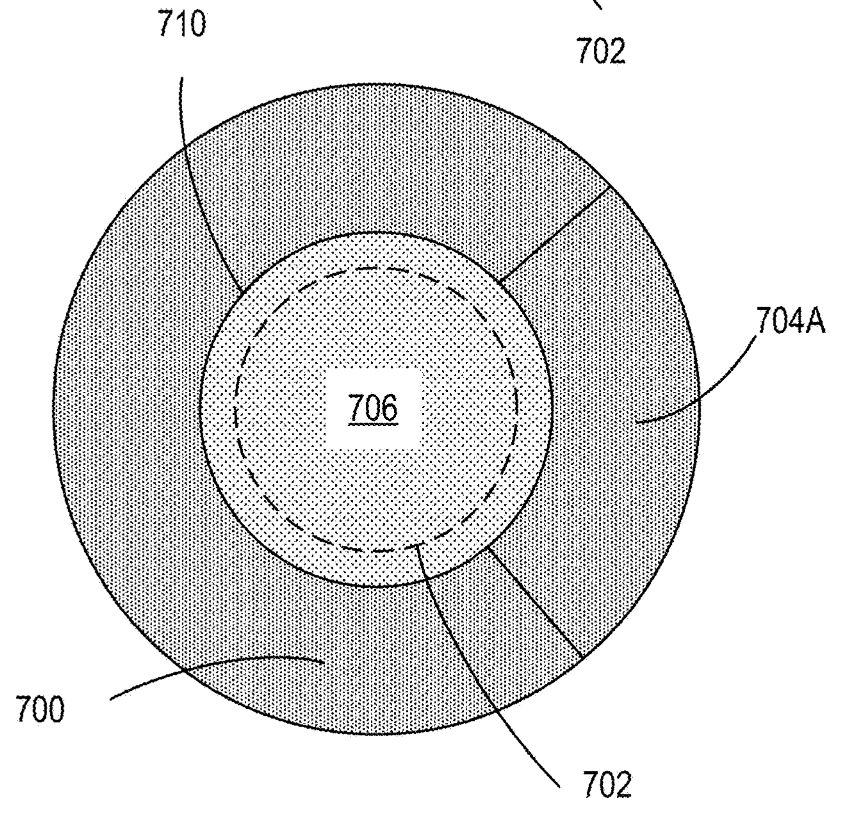

Referring to FIGS. 7A-7B, a representative sample mounting assembly 701 includes a surrounding member 700 adapted to receive a sample holder 702 that defines a recess 706 for insertion of a sample. The surrounding member 700 is ring-shaped and defines a wedge-shaped slot 704A that provides ion beam access to a sample at a glancing angle. The surrounding member 700 is provided with threads 708 for use in securing the surrounding member 700 in a CPB apparatus. An interior radius of the surrounding member 700 is greater than an interior radius of the sample holder 702 so that a shoulder region 710 is formed.

Example 8

Figure 8:
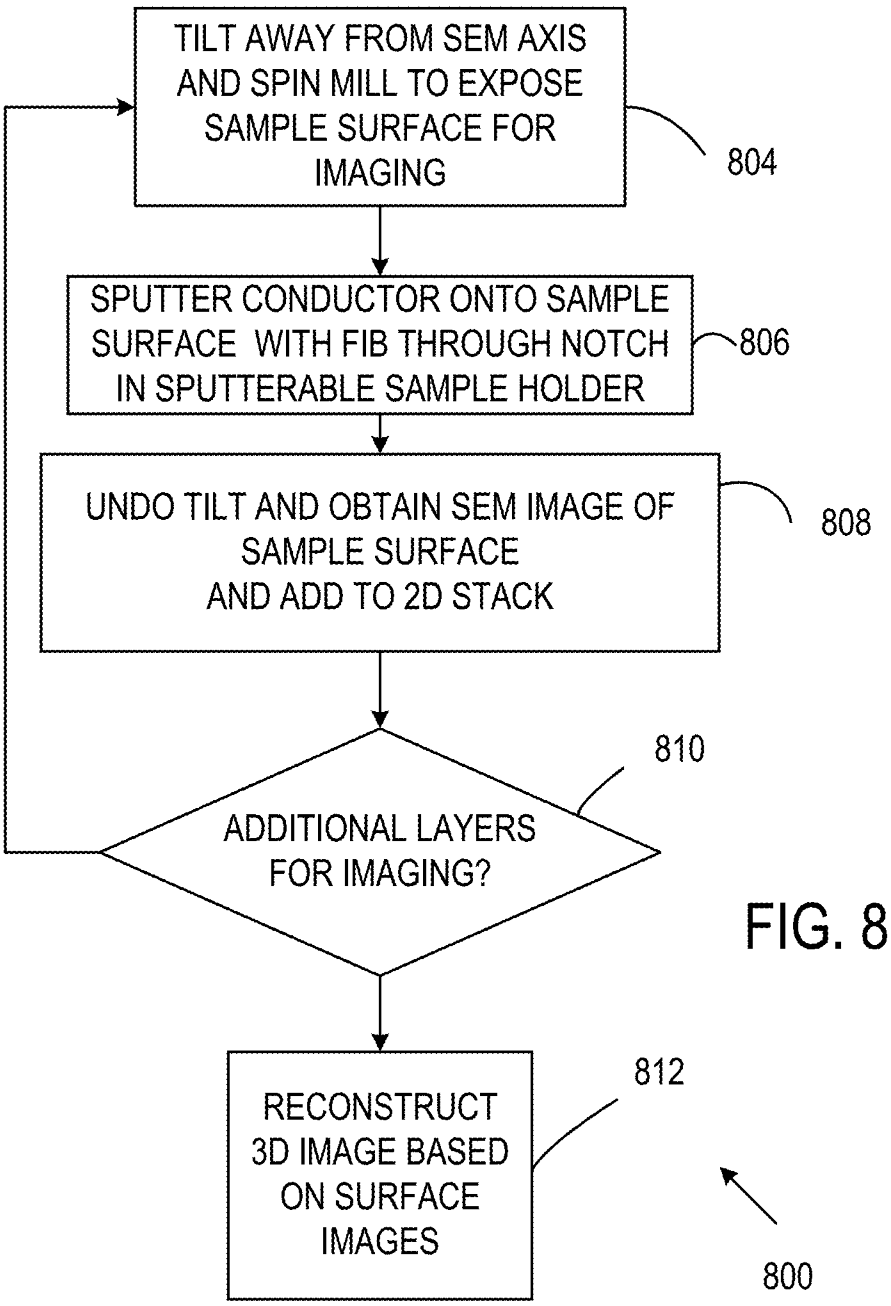
FIG. 8 illustrates a representative method of applying a sputtering layer and imaging a sample retained in a sample holder that provides a windowed sputtering target.

Referring to FIG. 8, a representative method 800 includes spin-milling a surface at 804 to expose a sample surface for imaging. In typical examples, the sample is tilted away from an imaging electron beam axis so that low angle milling is done at glancing angles. At 806, a conductor is sputtered onto the sample surface by directing an ion beam to a sputterable material through a notch, window, or aperture in a surrounding member. Typically, the tilted sample is rotated through a plurality of angles such as an odd number of equally spaced angles to produce sputtering plumes at different orientations with respect to the sample. At 808, the tilt of the sample is reversed, and one or more images of the sample surface are obtained. In some cases, the images are added as part of a stack of 2D images for eventual reconstruction. If additional images of the sample are to be acquired as determined at 810, processing returns to 804 for additional spin-milling, sputtering, and imaging at 808. This process can be repeated as needed to evaluate a selected sample volume. With 2D images acquired, the 2D image stack is processed to reconstruct a 3D image at 812.

Example 9

Figure 9A:
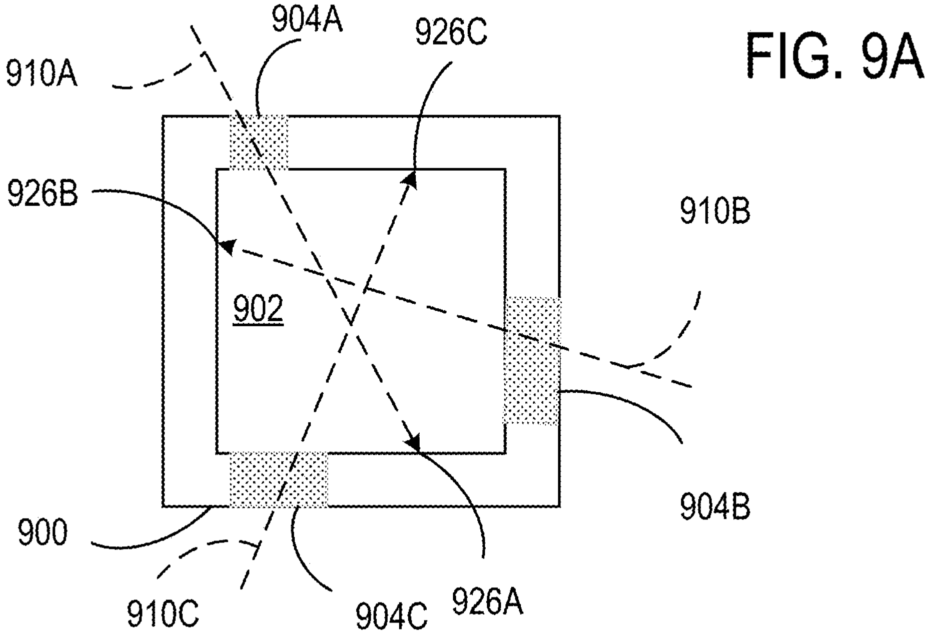
FIG. 9A illustrates a square ring-shaped sputterable surrounding member.

Referring to FIG. 9A, a square ring-shaped sample surrounding member 900 defines a plurality of slots 904A-904C that permit ion beam access to a sample volume 902 as well as to opposing internal surfaces 906A-906C of the surrounding member 900 itself. For example, an ion beam can be directed along respective paths 910A-910C to generate sputtering plumes from different directions to avoid shadowing to form a conductive layer on a sample surface. The beam paths 910A-910C are shown as different beam paths for purposes of illustration but typically a sample and the surrounding member 900 are rotated so that an ion beam propagates along a fixed path to produce sputtering from the internal surfaces 906A-906C.

Figure 9B:
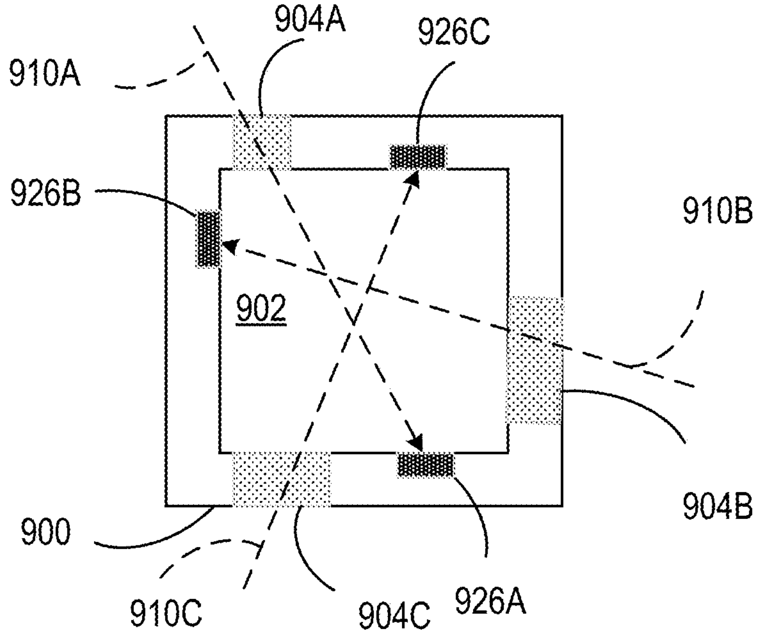
FIG. 9B illustrates a square ring-shaped surrounding member with sputterable inserts.

FIG. 9B illustrates an example similar to that of FIG. 9A, but in FIG. 9B, sputterable material is provided as inserts 926A-926C on the surrounding member 900. In such examples, the surrounding member need not provide the sputterable material and can be formed of any suitable material.

Example 10. Representative Implementation

Figures 10A, 10B, 10C:
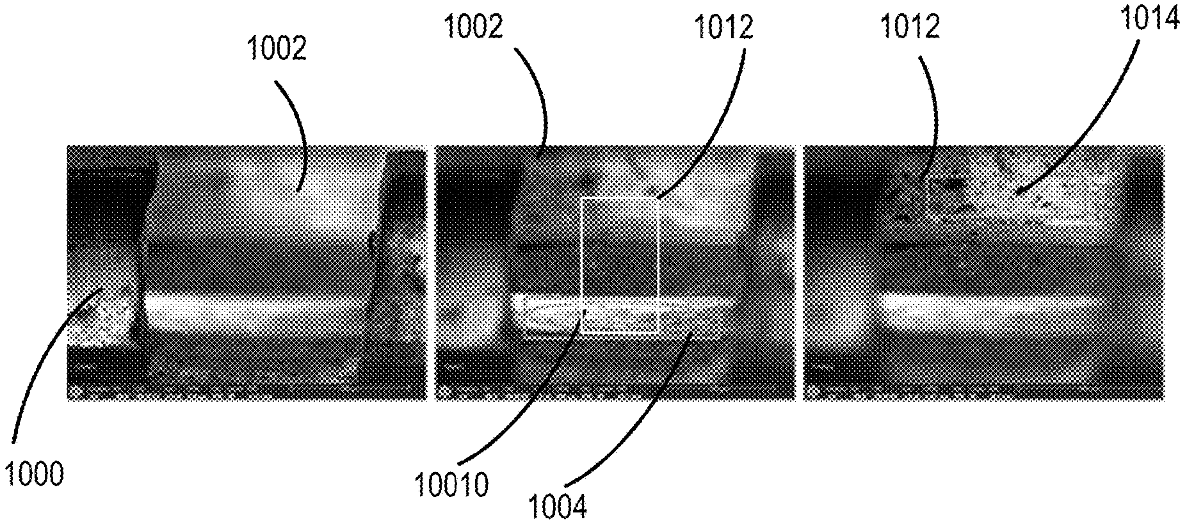
FIGS. 10A-10C are images of a sample situated in a windowed sample holder illustrating representative focused ion beam (FIB) positions for spin milling and sputtering.

FIG. 10A 10C are images of a portion of a representative surrounding member 1000 and a sample surface 1004 viewed through a slot 1002 in the surrounding member 1000. The image of FIG. 10A is focused on an exterior of the surrounding member 1000 at the slot 1002. The image of FIG. 10B is focused on the sample surface 1004 and illustrates a region 1010 over which an ion beam can be scanned. An internal surface 1012 of the surrounding member 1000 that can be used for sputtering is shown but is out of focus. FIG. 10C is an image focused on the interior surface 1012 and shows a region 1014 to which the ion beam can be directed for sputtering.

Example 11. Sample Images with and without Conductive Coatings

Figures 11A, 11B:
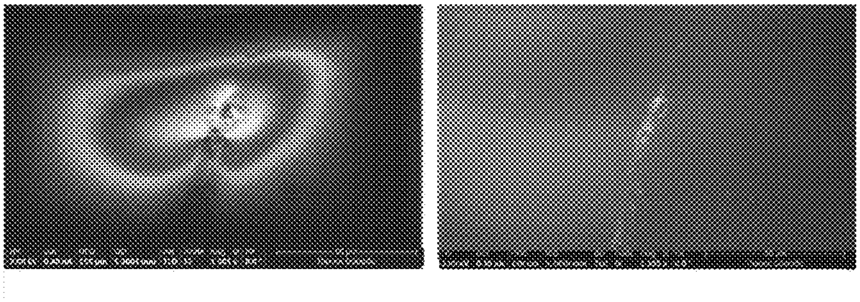
FIGS. 11A-11B illustrate imaging with and without a sputtered conductive coating.

FIG. 11A is a representative image of an ice sample obtained without a conductive coating such as a sputtered coating. FIG. 11B is a representative image of an ice sample under similar conditions but after application of a conductive layer by sputtering from a surrounding member. Sample details can be seen in the image of FIG. 11B while the image of FIG. 11A shows artifacts resulting from sample charging.

Additional Considerations

It is generally advantageous that sputtered films produced as discussed above provide electrical connection to that the sample is at a fixed potential, and in many examples, the sample is preferably maintained at ground potential. Grounding can be provided by electrical connection of the sample surface to an edge or other part of the sputtering target or other grounded feature. On samples involving TEM grids, the metallic grid bars are a convenient grounding point. On HPF samples, it is usually not possible to find grounded internal structures, and so contact must be made to the edge of the surrounding sputter target ring.

In some examples above, the surrounding members are generally symmetric about a central axis. However, such symmetry is not required, and asymmetric surrounding members generally do not degrade imaging.

Representative Embodiments

Embodiment 1 is a sputtering target for a sample situated for charged particle beam milling in a charged-particle beam instrument, including: a conductive material defining an internal cavity adapted to receive the sample at a sample surface, the conductive material defining at least one window that provides a glancing angle CPB processing path to the sample surface as situated in the CPB instrument; and a sputterable material situated opposite the at least one window to define a CPB sputtering path through the at least one window to the sputterable material.

Embodiment 2 includes the subject matter of Embodiment 1, and further specifies that the conductive material is a conductive ring that defines the internal cavity and that the at least one window is defined in the conductive ring.

Embodiment 3 includes the subject matter of any of Embodiments 1-2, and further specifies that the at least one window is a slot in the conductive ring.

Embodiment 4 includes the subject matter of any of Embodiments 1-3, and further specifies that the slot extends from a distal surface towards a plane associated with the sample surface.

Embodiment 5 includes the subject matter of any of Embodiments 1-4, and further specifies that the at least one window is an aperture in the conductive ring.

Embodiment 6 includes the subject matter of any of Embodiments 1-5, and further specifies that the conductive material is a sputterable material.

Embodiment 7 includes the subject matter of any of Embodiments 1-6 wherein the sputterable material is one or more of chromium, molybdenum, aluminum, titanium, nickel, silver, copper, indium, gold, platinum, iridium, palladium, or combinations thereof.

Embodiment 8 includes the subject matter of any of Embodiments 1-7, and further specifies that the sputterable material is one or more of whatever is realistic.

Embodiment 9 includes the subject matter of any of Embodiments 1-8, and further specifies that the conductive material is a conductive ring defining a plurality of windows.

Embodiment 10 includes the subject matter of any of Embodiments 1-9 wherein each of the plurality of windows is a slot that extends from a distal surface of the conductive ring towards a sample plane.

Embodiment 11 includes the subject matter of any of Embodiments 1-10 and further specifies that each of the plurality of windows is an aperture in the conductive ring.

Embodiment 12 includes the subject matter of any of Embodiments 1-11, and further specifies that the plurality of windows is evenly situated about an axis defined by the conductive ring.

Embodiment 13 includes the subject matter of any of Embodiments 1-12, and further specifies that the plurality Embodiment 14 includes the subject matter of any of Embodiments 1-13, and further includes a sample base configured to support the sample and insertable into the conductive ring.

Embodiment 15 includes the subject matter of any of Embodiments 1-14, and the conductive ring include fastening means adapted to secure at least one of the sample base and the conductive ring along an axis of the CPB instrument.

Embodiment 16 includes the subject matter of any of Embodiments 1-15, and further specifies that the conductive material is a crenellated conductive ring.

Embodiment 17 is a method comprising: directing a CPB through a window in sample mount to a sputtering target at a glancing angle with respect to a sample surface to sputter a conductive material on at least a portion of the sample surface; and directing a CPB through the window to the sample at a glancing angle to process at least a portion of the sample surface.

Embodiment 18 includes the subject matter of Embodiment 17, and further includes directing the CPB to a sputtering target through at least two windows in the sample mount to the sputtering target at the glancing angles with respect to the sample surface and then directing the CPB to process the sample surface.

Embodiment 19 includes the subject matter of any of Embodiments 17-18, and further includes: rotating the sample and the sample mount; and directing the CPB through each of the at least two windows at a respective rotation angle.

Embodiment 20 includes the subject matter of any of Embodiments 17-19, and further includes directing the CPB to the sputtering target through an odd number of windows in the sample mount.

Embodiment 21 is a sample holder for electron microscopy, including a crenellated circular conductive ring of a sputterable material defining an interior volume, and a conductive sample support adapted to retain a sample within the interior volume defined by crenellated circular conductive ring.

In view of the many possible embodiments to which the principles of the disclosed technology may be applied, it should be recognized that the illustrated embodiments are only preferred examples and should not be taken as limiting the scope of the disclosure. I therefore claim all that comes within the scope and spirit of the appended claims.

I claim:

1. A sputtering target for a sample situated for charged particle beam milling in a charged-particle beam (CPB) instrument, comprising:

a conductive material defining an internal cavity adapted to receive the sample at a sample surface, the conductive material defining at least one window that provides a glancing angle CPB processing path to the sample surface as situated in the CPB instrument; and a first sputterable material situated opposite the at least one window to define a CPB sputtering path through the at least one window to the first sputterable material.

2. The sputtering target of claim 1, wherein the conductive material is a conductive ring that defines the internal cavity and that the at least one window is defined in the conductive ring.

3. The sputtering target of claim 2, wherein the at least one window is a slot in the conductive ring.

4. The sputtering target of claim 3, wherein the slot extends from a distal surface towards a plane associated with the sample surface.

5. The sputtering target of claim 2, wherein the at least one window is an aperture in the conductive ring.

6. The sputtering target of claim 2, wherein the conductive material is a sputterable material.

7. The sputtering target of claim 6 wherein either one or both of the first sputterable material and the second sputterable material are one or more of chromium, molybdenum, aluminum, titanium, nickel, silver, copper, indium, gold, platinum, iridium, palladium, or combinations thereof.

8. The sputtering target of claim 6, wherein the one or both of the first sputterable material and the second sputterable material are one or more of stainless steel or gold.

9. The sputtering target of claim 1, wherein the conductive material is a conductive ring defining a plurality of windows.

10. The sputtering target of claim 9 wherein each of the plurality of windows is a slot that extends from a distal surface of the conductive ring towards a sample plane.

11. The sputtering target of claim 9, wherein each of the plurality of windows is an aperture in the conductive ring.

12. The sputtering target of claim 9, wherein the plurality of windows is evenly situated about an axis defined by the conductive ring.

13. The sputtering target of claim 11, wherein the plurality of windows includes 3 or 5 windows.

14. The sputtering target of claim 11, further comprising a sample base configured to support the sample and insertable into the conductive ring.

15. The sputtering target of claim 14, wherein the conductive ring includes fastening means adapted to secure at least one of the sample base and the conductive ring along an axis of the CPB instrument.

16. The sputtering target of claim 1, wherein the conductive material is a crenellated conductive ring.

17. A method comprising:

directing a CPB through a window in a sample mount to a sputtering target at a glancing angle with respect to a sample surface to sputter a conductive material on at least a portion of the sample surface; and directing a CPB through the window to the sample surface at a glancing angle to process at least a portion of the sample surface.

18. The method of claim 17, further comprising directing the CPB to a sputtering target through at least two windows in the sample mount to the sputtering target at the glancing angle with respect to the sample surface and then directing the CPB to process the sample surface.

19. The method of claim 18, further comprising:

rotating the sample surface and the sample mount; and directing the CPB through each of the at least two windows at a respective rotation angle.

20. The method of claim 17, further comprising directing the CPB to the sputtering target through an odd number of windows in the sample mount at the glancing angle.

21. A sample holder for electron microscopy, comprising:

a crenellated circular conductive ring of a sputterable material defining an interior volume; and a conductive sample support adapted to retain a sample within the interior volume defined by crenellated circular conductive ring.

22. The sputtering target of claim 6, wherein the first sputterable material is the same as the second sputterable material.

* * * * *